(12) United States Patent
Krauss et al.

(10) Patent No.: US 11,676,787 B2
(45) Date of Patent: Jun. 13, 2023

(54) CIRCUIT BREAKER

(71) Applicant: Siemens Aktiengesellschaft, Munich (DE)

(72) Inventors: Andreas Krauss, Berlin (DE); Michael Stehle, Postbauer-Heng (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 70 days.

(21) Appl. No.: 16/495,576

(22) PCT Filed: Dec. 13, 2017

(86) PCT No.: PCT/EP2017/082598
§ 371 (c)(1),
(2) Date: Sep. 19, 2019

(87) PCT Pub. No.: WO2018/171923
PCT Pub. Date: Sep. 27, 2018

(65) Prior Publication Data
US 2020/0013574 A1 Jan. 9, 2020

(30) Foreign Application Priority Data
Mar. 24, 2017 (DE) .................. 10 2017 205 003.9

(51) Int. Cl.
*H01H 47/22* (2006.01)
*H01F 1/147* (2006.01)
(Continued)

(52) U.S. Cl.
CPC ......... *H01H 47/22* (2013.01); *H01F 1/14733* (2013.01); *H01F 1/34* (2013.01);
(Continued)

(58) Field of Classification Search
CPC ...... H01H 47/22; H01H 71/10; H01H 71/125; H01H 71/123; H01F 1/14733; H01F 1/36;
(Continued)

(56) References Cited

U.S. PATENT DOCUMENTS 4,409,542 A * 10/1983 Becker .................. H02H 3/365
324/434
4,578,732 A  3/1986 Draper et al.
(Continued)

FOREIGN PATENT DOCUMENTS

AT  406208 B  3/2000
CN  101118797 A  2/2008
(Continued)

OTHER PUBLICATIONS

International Search Report PCT/ISA/210 for International Application No. PCT/EP2017/082598 dated Apr. 26, 2018.
(Continued)

*Primary Examiner* — Thienvu V Tran
*Assistant Examiner* — Sreeya Sreevatsa
(74) *Attorney, Agent, or Firm* — Harness, Dickey & Pierce, P.L.C.

(57) ABSTRACT

The application relates to a power switch for breaking an electrical circuit when current and/or current time span threshold values are exceeded, including an energy converter, which on the primary side is connected to the electrical circuit, and on the secondary side provides an energy supply for at least one control unit of the power switch. A choke is connected between the secondary-side output of the energy converter and the control unit of the power switch.

19 Claims, 2 Drawing Sheets

(51) Int. Cl.
  *H01F 1/36* (2006.01)
  *H01H 71/10* (2006.01)
  *H03H 7/06* (2006.01)
  *H02H 1/06* (2006.01)
  *H02H 9/02* (2006.01)
  *H01F 1/34* (2006.01)
  *H02H 3/08* (2006.01)

(52) U.S. Cl.
  CPC ............... *H01F 1/36* (2013.01); *H01H 71/10* (2013.01); *H02H 1/06* (2013.01); *H02H 3/08* (2013.01); *H02H 9/02* (2013.01); *H03H 7/06* (2013.01)

(58) Field of Classification Search
  CPC .......... H01F 1/34; H01F 27/255; H01F 38/32; H03H 7/06; H02H 1/06; H02H 1/0007; H02H 3/08; H02H 3/093; H02H 9/02
  USPC ...................................................... 361/93.9
  See application file for complete search history.

(56) References Cited

U.S. PATENT DOCUMENTS

| | | | | |
|---|---|---|---|---|
| 5,448,442 A * | 9/1995 | Farag | ................ | H02H 7/0822 361/25 |
| 5,490,030 A * | 2/1996 | Taylor | ................ | H02H 3/33 361/45 |
| 5,926,355 A * | 7/1999 | Matsko | ................ | H02H 1/06 361/96 |
| 6,094,330 A * | 7/2000 | Criniti | ................ | H01H 71/123 361/93.7 |
| 6,373,257 B1 * | 4/2002 | Macbeth | ................ | G01R 31/3277 324/509 |
| 8,048,191 B2 * | 11/2011 | Lu | ................ | B22F 1/0059 75/255 |
| 10,916,929 B2 * | 2/2021 | Kopaczewski | .... | G01R 31/3275 |
| 2009/0251938 A1 | 10/2009 | Hallak | | |
| 2013/0329331 A1 * | 12/2013 | Erger | ................ | H01H 71/04 361/102 |
| 2015/0249395 A1 * | 9/2015 | Xiong | ................ | H02M 3/33546 363/21.06 |
| 2016/0247623 A1 | 8/2016 | Marusawa et al. | | |
| 2017/0257089 A1 * | 9/2017 | Zehetbauer | ................ | H03K 17/0814 |
| 2018/0076611 A1 | 3/2018 | Geissler et al. | | |
| 2018/0151285 A1 * | 5/2018 | Kwon | ................ | H01F 3/08 |

FOREIGN PATENT DOCUMENTS

| | | | | |
|---|---|---|---|---|
| CN | 101461125 A | | 6/2009 | |
| CN | 102568959 A | | 7/2012 | |
| CN | 103578691 A | | 2/2014 | |
| CN | 103606904 A | | 2/2014 | |
| CN | 105006336 A | | 10/2015 | |
| CN | 107819317 A | | 3/2018 | |
| DE | 1763950 A1 | | 1/1972 | |
| DE | 3537029 A1 | | 4/1987 | |
| DE | 19940344 A1 | | 3/2001 | |
| DE | 102010033238 A1 | | 2/2012 | |
| DE | 102013100246 A1 * | | 7/2014 | ........... G01R 15/183 |
| JP | S5975784 U * | | 5/1984 | |
| JP | H10327036 A | | 12/1998 | |

OTHER PUBLICATIONS

Written Opinion of the International Seaching Authority PCT/ISA/237 for International Application No. PCT/EP2017/082598 dated Apr. 26, 2018.

German Office Action for German Application No. 10 2017 205 003.9 dated Jan. 24, 2018.

Office Action for Chinese Patent Application No. 201780089978.1 dated Dec. 25, 2020 and English translation thereof.

Notice of Allowance for Chinese Patent Application No. 201780089978.1 dated Jun. 25, 2021 and English translation thereof.

* cited by examiner

CIRCUIT BREAKER

PRIORITY STATEMENT

This application is the national phase under 35 U.S.C. § 371 of PCT International Application No. PCT/EP2017/082598, which has an International filing date of Dec. 13, 2017, which the United States of America and which claims priority to German Patent Application No. DE 102017205003.9 filed Mar. 24, 2017, the entire contents of which are hereby incorporated herein by reference.

FIELD

Embodiments of the invention relate to a circuit breaker.

BACKGROUND

Circuit breakers are protective devices which function in a similar manner to a fuse. Circuit breakers monitor the current flowing through them by way of a conductor and interrupt the electric current or energy flow to an energy sink or a load, which is referred to as tripping, if protective parameters such as current limit values or current-time period limit values, that is to say if a current value is present for a certain time period, are exceeded. The interruption is effected, for example, by way of contacts of the circuit breaker which are opened.

In particular for low-voltage circuits or networks, there are different types of circuit breakers depending on the magnitude of the electric current provided in the electrical circuit. In the sense of the invention, circuit breaker is taken to mean, in particular, switches such as are used in low-voltage installations for currents of 63 to 6300 amperes. More specifically, closed circuit breakers are used for currents of 63 to 1600 amperes, in particular of 125 to 630 or 1200 amperes. Open circuit breakers are used in particular for currents of 630 to 6300 amperes, more specifically of 1200 to 6300 amperes.

Open circuit breakers are also referred to as air circuit breakers, ACB for short, and closed circuit breakers are referred to as molded case circuit breakers or compact circuit breakers, MCCB for short.

Low voltage is taken to mean, in particular, voltages of up to 1000 volts AC voltage or 1500 volts DC voltage.

In the sense of embodiments of the invention, circuit breaker is taken to mean, in particular, circuit breakers having a control unit, such as an electronic trip unit, ETU for short. The control unit monitors the magnitude of the electric current measured by sensors, such as Rogowski coils, or in addition analogously of the voltage or/and of other parameters of the electrical circuit and brings about an interruption of the electrical circuit. The operation of the control unit requires electrical energy, which is made available by an energy converter, for example a transformer. The latter is connected to the electrical circuit to be protected on the primary side and to the control unit on the secondary side.

In the event of an excessively "high" current flow, circuit breakers interrupt the circuit in accordance with their protection parameters or response values. The protection parameters or response values are essentially the magnitude of the current or/and the magnitude of the current and of the time after which the circuit is intended to be interrupted in the event of a persistently "high" current flow. In contrast to a fuse, the protection parameters or response values are adjustable in the case of a circuit breaker, for example by way of the control unit, such as an electronic trip unit.

The energy converters are used for the so-called self energy supply of circuit breakers. They are based on the principle of magnetically coupled power transfer, as a result of which energy is made available for the control unit, such as an electronic trip unit.

In this case, a conductor of the electrical circuit often forms the primary side of the energy converter. That is to say that, for example, the electrical conductor is the primary coil of the energy converter.

What is problematic about these converters is high primary currents, which cause a correspondingly high secondary current (transformer principle). Such high primary currents can occur particularly in the case of high load currents or short-circuit currents. As a consequence, the apparent power of the current converter is exceeded. As a result, the energy converter attains the state of magnetic saturation.

The apparent power of a current converter rises linearly with the primary current amplitude and the power supply system frequency. This results in a minimum primary current that is necessary in order to satisfy the secondary-side power requirement of the control unit or ETU. The minimum primary current is defined by the requirements of the application and this results in the magnetic dimensioning of the ferromagnetic core in the energy converter or current converter (in particular the material selection and also the magnetic core length and cross section). A minimum magnetic cross section A essentially arises for a magnetic operating point B derived from a required secondary voltage U at the power supply system frequency f. This is described by the known transformer equation:

$$U = 4.4 * N2 * \bullet A * B * f$$

The secondary current I2 results from the turns ratio N2 relative to the primary current I1, wherein the magnetization current Iµ required for generating the magnetic flux should be subtracted from the primary current.

$$I2 = (I1 - I\mu)/N2$$

The product of both secondary variables defines the apparent power of the current converter. If the apparent power is less than the power consumption arranged on the secondary side, then the magnetic core attains saturation since the magnetic flux density is limited by the core material.

Above the minimum primary current, the apparent power rises in a manner driven by the primary current amplitude. However, the power consumption of the electronics remains largely constant for all operating conditions and this gives rise to the abovementioned mismatch between source (energy converter or current converter) and sink (control unit or ETU). The excess power is converted into heat in the input voltage regulator and/or in the secondary winding. This heat has to be dissipated or critical self heating arises in the control unit and/or in the energy converter.

Energy converters, such as current converters, which operate in the linear region up to approximately 200% of the defined primary current are currently in use for circuit breakers.

SUMMARY

At least one embodiment of the present invention improves a circuit breaker, in particular to reduce the apparent power or heating.

Embodiments are directed to a circuit breaker and an inductor for a circuit breaker.

At least one embodiment of the invention is directed to a circuit breaker for interrupting an electrical circuit in an event of at least one of current and current-time period limit values being exceeded, comprising:

an energy converter, a primary side of the energy converter being connected to the electrical circuit and a secondary side of the energy converter being configured to provide an energy supply for at least one control unit of the circuit breaker; and an inductor, connected between a secondary-side output of the energy converter and the at least one control unit of the circuit breaker.

At least one embodiment of the invention is directed to an inductor for the circuit breaker.

DETAILED DESCRIPTION OF THE EXAMPLE EMBODIMENTS

Figure 1:
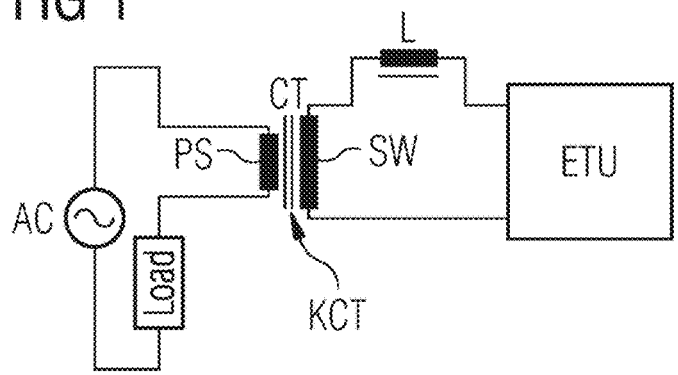
FIG. 1 shows a first circuit diagram with an inductor according to an embodiment of the invention.

At least one embodiment of the present invention improves a circuit breaker, in particular to reduce the apparent power or heating.

Embodiments are directed to a circuit breaker and an inductor for a circuit breaker.

According to at least one embodiment of the invention, provision is made for providing an inductor, if appropriate having advantageous configurations, between energy converter and control unit of the circuit breaker.

The apparent power of the energy converter or transformer is determined by the primary current. The energy converter or transformer operates without a fixed phase relationship between current and voltage on the secondary side. Therefore, it is also not absolutely necessary to draw an active power. If a reactance is additionally inserted in series, then the apparent power of the transformer can be compensated for by the reactive power at this impedance. For this purpose, an inductor is inserted between energy converter and control unit (ETU).

Advantageous configurations are specified in the claims.

In one advantageous configuration of an embodiment of the invention, a conductor of the electrical circuit forms the primary side of the energy converter.

This has the particular advantage that the apparent power is effectively reduced in particular for energy converters in which the primary side is formed directly by the conductor.

In one advantageous configuration of an embodiment of the invention, the inductor is arranged at a first spatial distance from the energy converter; in particular, the core of the energy converter and the core of the inductor are isolated to the greatest possible extent with regard to magnetic and electric fields.

This has the particular advantage that eddy current losses in the region of the contact surfaces of both cores are avoided, as a result of which thermal problems are reduced.

In one advantageous configuration of an embodiment of the invention, the inductor is arranged in particular horizontally with respect to the primary conductor. Horizontal arrangement is taken to mean, in particular, an arrangement in which the area enclosed by the inductor core, in particular the area of greatest extent of the inductor core, is arranged parallel to the primary conductor or current-carrying conductor track.

This has the particular advantage that the magnetic field enclosing the primary conductor acts homogeneously on the inductor core and the parasitic influence of the primary conductor field on the inductor is thus minimized.

In one advantageous configuration of an embodiment of the invention, the inductor has a magnetic powder core, in particular in closed form.

This has the particular advantage that the permeability of the inductor core is reduced by the air gap distributed in the core material and the magnetic saturation of the core is thus shifted to high secondary currents.

In one advantageous configuration of an embodiment of the invention, the powder core comprises Fe, Fe/Ni alloys or ferrite.

This has the particular advantage that a particularly inexpensive and easily available solution is made possible since these materials are inexpensive and readily available.

In one advantageous configuration of an embodiment of the invention, the powder core is a toroidal core, a U- or E-shaped half-core implemented twice or with a terminating I-shaped connecting core.

This has the particular advantage that the design can be chosen optimally on the basis of the available structural space in the device.

In one advantageous configuration of an embodiment of the invention, the inductor has a magnetic core composed of high-permeability material, e.g. having an air gap.

This has the particular advantage that the permeability can be set very accurately by the ratio of magnetic core length to air gap width. The inductor inductance in this configuration thus remains largely constant until magnetic saturation is attained.

In one advantageous configuration of an embodiment of the invention, the high-permeability material comprises ferrite, nanocrystalline strip or electrical sheet.

This has the particular advantage that the magnetic core losses at higher frequencies are low.

In one advantageous configuration of an embodiment of the invention, the secondary-side output of the energy converter is connected to a low-pass filter, the output of which is connected to the control unit via the inductor.

This has the particular advantage that high magnetization reversal losses as a result of current harmonics are reduced or avoided. The low-pass filter forms a low-impedance electrical bypass for all current components above the filter frequency which are damped.

In one advantageous configuration of an embodiment of the invention, the low-pass filter has a capacitor.

This has the particular advantage of providing a particularly simple realization of a low-pass filter.

In one advantageous configuration of an embodiment of the invention, the capacitor is connected in series with a resistor.

This has the particular advantage of achieving a simple realization while avoiding excessively high currents of the current harmonics.

In one advantageous configuration of an embodiment of the invention, a resistor is connected in parallel with the capacitor.

This has the particular advantage that the parallel circuit resonance of inductance of the secondary winding and capacitor is damped.

In one advantageous configuration of an embodiment of the invention, an overvoltage protection element is connected in parallel with the secondary-side output of the energy converter.

This has the particular advantage of limiting voltage spikes for currents above normal operating situations.

All configurations, both in dependent form referring back to the independent claim and referring back only to individual features or feature combinations from patent claims, bring about an improvement of a circuit breaker.

The described properties, features and advantages of this invention and the way in which they are achieved will become clearer and more clearly understood in association with the following description of the example embodiments which are explained in greater detail in association with the drawing.

FIG. 1 shows a first circuit diagram for elucidating an embodiment of the invention. An AC source AC serving as energy source supplies an energy consumer Load serving as energy sink. A conductor of this circuit forms the primary side PS of an energy converter CT. In this case, the conductor can have a plurality of turns of a primary coil of the energy converter CT. However, it is also possible for only the conductor (without a turn) to be led precisely through or past a core KCT of the energy converter CT.

In this case, the core KCT of the energy converter CT furthermore has a secondary side SW formed by one or more turns of a secondary winding or coil.

The two terminals of the secondary winding SW form the secondary-side output of the energy converter CT, which makes available an energy supply for the two inputs of the at least one control unit ETU of the circuit breaker (not illustrated).

A respective output of the secondary winding is electrically connected to an input of the at least one control unit.

According to an embodiment of the invention, an inductor L is provided in at least one connection between the output of the secondary winding and the input of the at least one control unit.

Figure 2:
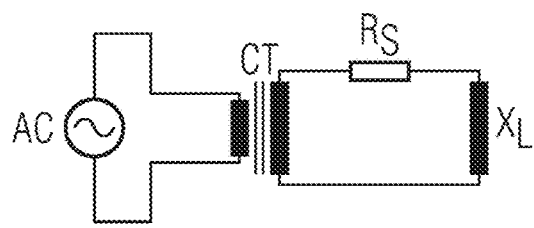
FIG. 2 shows a second circuit diagram with an inductor according to an embodiment of the invention for elucidation.

FIG. 2 shows a second circuit diagram in accordance with FIG. 1, with the difference that electrical equivalent circuit diagrams for the inductor L are illustrated on the secondary side. The control unit ETU is in a bypass mode in this case.

Figure 3:
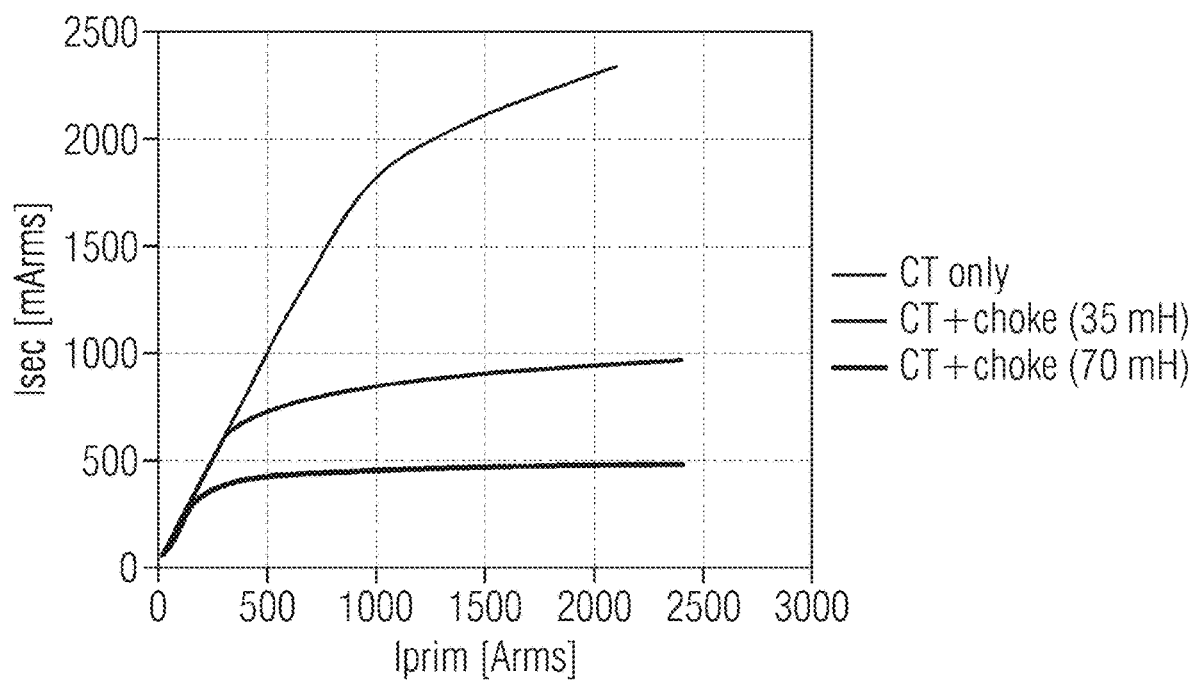
FIG. 3 shows a first diagram for illustrating the relationship between primary current and secondary current of a circuit breaker according to an embodiment of the invention.

FIG. 3 shows a first diagram for illustrating the relationship between primary current and secondary current of a circuit breaker according to an embodiment of the invention.

The primary current Iprim in amperes [Arms] of the primary side PS of the energy converter CT is illustrated on the horizontal X-axis. The secondary current Isec in milliamperes [mArms] is illustrated on the vertical Y-axis.

Three curves are illustrated in the diagram. A first curve "CT only" for the operation of the energy converter CT without an inductor L according to the invention. Here there exists a linear relationship between primary current Iprim and secondary current Isec until a first primary current value, in the example 1000 amperes [Arms] is reached. Afterward, the core of the energy converter attains saturation and the secondary current increases in a decreasingly proportional manner.

A second curve "CT+choke (35 mH)" for the operation of the energy converter CT with a first inductor L according to the invention, the inductor having an inductance of 35 mH. Here there exists a linear relationship between primary current Iprim and secondary current Isec until a second, smaller primary current value, in the example approximately 300 amperes [Arms], is reached. Afterward, the inductor L according to an embodiment of the invention brings about a limitation of the secondary current, which increases in a greatly decreasingly proportional manner or progresses with a "flat" profile approximately to a limit value, in the example approximately 1000 mA [mArms].

A third curve "CT+choke (70 mH)" for the operation of the energy converter CT with a second inductor L according to an embodiment of the invention, the inductor having an inductance of 70 mH. Here there exists a linear relationship between primary current Iprim and secondary current Isec until a third, even smaller primary current value, in the example approximately 150 amperes [Arms], is reached. Afterward, the inductor L according to the invention brings about a limitation of the secondary current, which increases in an even more greatly decreasingly proportional manner or progresses with a "flat" profile approximately to a limit value, in the example approximately 500 mA [mArms].

Figure 4:
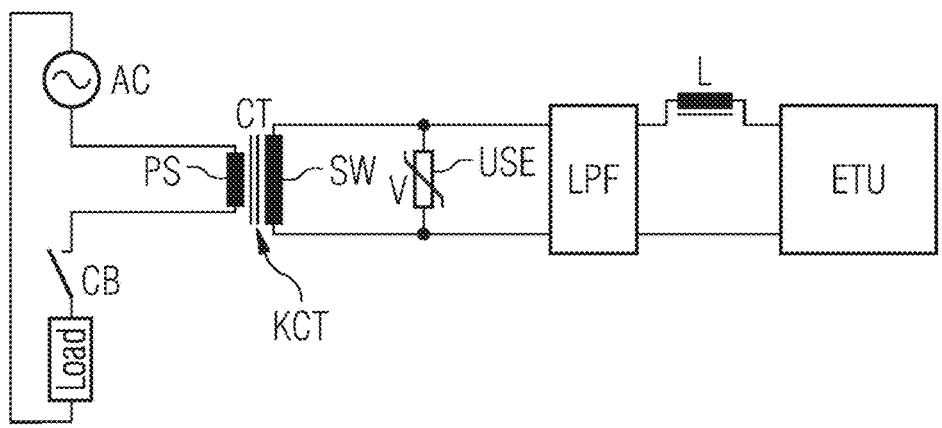
FIG. 4 shows a third circuit diagram with a configuration of the circuit breaker according to an embodiment of the invention.

FIG. 4 shows a third circuit diagram of a configuration of the circuit breaker according to an embodiment of the invention in accordance with FIG. 1, with the difference that the outputs of the energy converter CT are connected to the inputs of a low-pass filter LPF. The outputs of the low-pass filter LPF are connected to the inputs of the control unit ETU via at least one inductor L. Furthermore, an overvoltage protection element USE is connected in parallel with the output of the energy converter CT, that is to say that the two outputs are connected to one another by way of the overvoltage protection element USE.

Furthermore, the illustration shows a switching contact CB for interrupting the primary-side electrical circuit, formed by the energy source AC and the consumer Load, by way of the circuit breaker, not illustrated in more specific detail.

Figure 5:
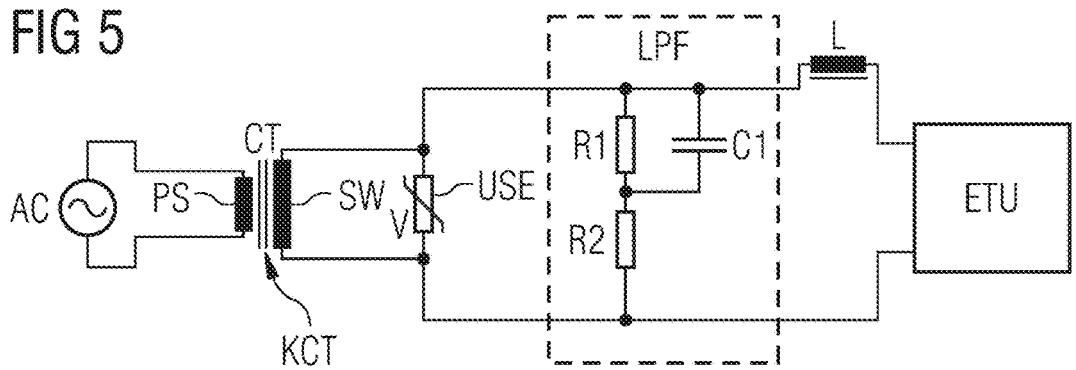
FIG. 5 shows a fourth circuit diagram with a configuration of the circuit breaker according to an embodiment of the invention.

FIG. 5 shows a fourth circuit diagram with a configuration of the circuit breaker according to an embodiment of the invention in accordance with FIG. 4, with the difference that details of the low-pass filter LPF are shown.

In this case, the low-pass filter LPF has a direct electrical connection of its first input terminal to its first output terminal and a direct electrical connection of its second input terminal to its second output terminal.

Here in the simplest case a capacitor C1 is connected between first input terminal and second input terminal (or respectively first output terminal and second output terminal) of the low-pass filter LPF.

By way of example, a first resistor R1 can be connected in parallel with the capacitor.

Furthermore, a second resistor R2 can be connected in series with the capacitor C1 or the parallel connection formed from capacitor C1 and first resistor R1. The latter option is illustrated in FIG. 5.

Furthermore, instead of the direct electrical connection, an inductance, for example without a core, can be connected between at least one input terminal of the low-pass filter and at least one output terminal of the low-pass filter.

Figure 6:
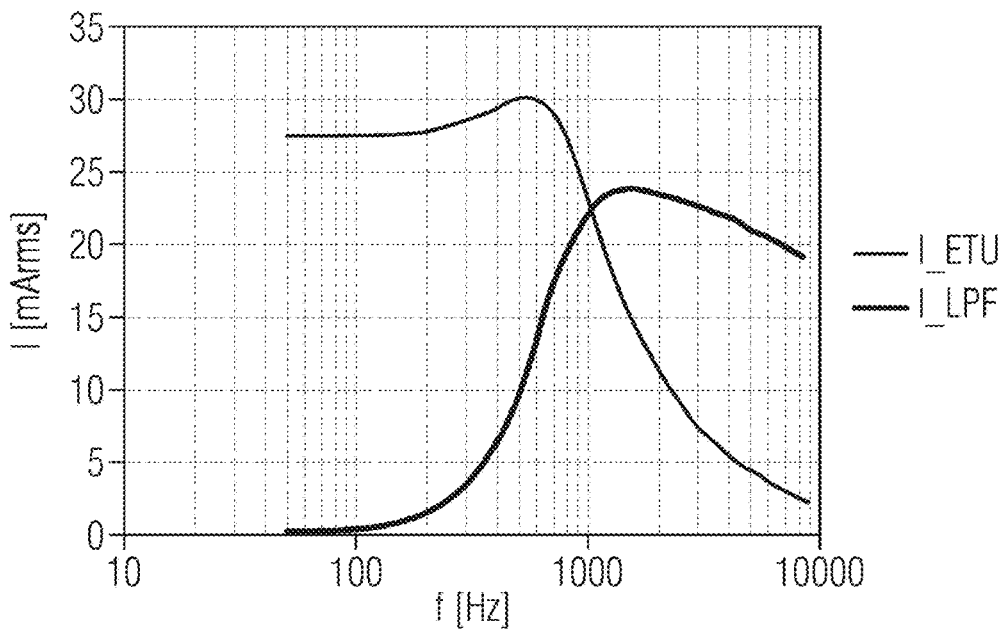
FIG. 6 shows a second diagram for illustrating the relationship of the frequency response of the current distribution between control unit and low-pass filter.

FIG. 6 shows a second diagram for illustrating the relationship of the frequency response of the current distribution between control unit and low-pass filter.

The frequency f (Hz) of the secondary current is illustrated on the horizontal X-axis. The secondary current I in milliamperes (mArms) is illustrated on the vertical Y-axis.

Two curves are illustrated in the diagram. A first curve "I_ETU" for the secondary current as a function of the frequency through the control unit ETU. In this case, the secondary current is relatively constant up to a first frequency, in the example approximately 700 Hz; as the frequency increases, the current through the control unit decreases greatly.

A second curve "I_LPF" for the current as a function of the frequency through the low-pass filter LPF. In this case, the current is relatively low until a second frequency, in the example approximately 400 Hz, is reached, and then increases greatly.

An embodiment of the invention will be explained in greater detail below with reference to the drawings.

The dimensioning of the inductor inductance L results from the required reactance XL between the maximum root-mean-square secondary voltage U, given by the saturation magnetization Bct in the energy converter, and the root-mean-square secondary current I.

For the case of an optionally provided activated electronic bypass circuit in the control unit of the circuit breaker, on the secondary side substantially only the effective resistance RS of the secondary winding and of the inductor winding is arranged in series with the reactance XL, FIG. 2. Taking account of the typical condition RS<XL this gives $$I=U/\text{Root of }(Rs^2+XL^2)\approx U/XL$$

$$XL=4.4*N2*A*B*F/I=2Pi f*L$$

$$L=\mu o*\mu r*(A\text{choke}/l\text{choke})*N^2$$

In the dimensioning of the inductor (Achoke, Ichoke, N) it is absolutely necessary to give consideration to ensuring that the inductor does not attain saturation, since otherwise the inductance collapses and the excess energy can no longer be stored magnetically. Therefore, it is always necessary to give consideration to ensuring that the secondary peak current I complies with the relationship $$B\text{choke}=\mu o*\mu r*N*I/l\text{choke}\ll B sat$$

This can be achieved for example by choosing a relatively low permeability μr, such as e.g. in the case of:
high-permeability cores having an air gap dgap=>μr≈lchoke/dgap
magnetic powder cores according to the invention, e.g. composed of Fe, Fe/Ni alloys or ferrites.

FIG. 3 shows by way of example the achievable reduction of the secondary current by the insertion of inductors having different inductances. It can be discerned that the secondary current can be greatly limited. It follows from this that the power loss in the Cu winding $$Ps=Rs*I^2$$

can be very greatly reduced.

What is disadvantageous about the series connection of energy or current converter and inductor is the occurrence of high voltage spikes between inductor and current converter. The occurrence of a back EMF is caused by the self-induction in the inductor with secondary current flowing. The voltage magnitude rises with the rate of change of the primary current and is therefore proportional to the power supply system frequency and the primary current amplitude.

$$Ul=-L*dI2/dt\approx 2Pi f*I1/N2$$

For the short-circuit currents possible in the application, extremely high voltage peaks can occur on the secondary side. There is therefore the risk that the voltage peaks can break down the isolation of the secondary or inductor winding or else isolation paths with respect to adjacent metallic surfaces.

Structural design parameter are subject to the limitations as a result of the structural space available. Therefore, a spatially close arrangement of main core and inductor may be necessary. According to the invention, main core, i.e. core of the energy converter, and inductor core are intended to be isolated as far as possible with regard to magnetic and electric fields, in order to achieve a good separation of primary circuit and secondary circuit.

In the case of high short-circuit currents, the high primary magnetic field generates an additional magnetic flux in the spatially closely adjacent inductor core, which disturbs or in the extreme case even cancels the inductor effect. The consequence is the collapse of the secondary-side current limiting as a result of the absent reactance.

The negative influence of the primary magnetic field in the case of high short-circuit currents can be reduced by way of a parallel arrangement of the area surrounded by the inductor core with respect to the current-carrying primary conductor track, i.e. a horizontal arrangement.

Preferably, the inductor is arranged outside the energy converter/current converter, to put it more precisely not in the vicinity of the primary conductors.

Embodiments of the invention therefore proposes using a separate inductor having a, preferably closed, magnetic powder core. The powder core can preferably consist of Fe, Fe/Ni alloy, ferrite or the like. An example of a suitable design is toroidal cores. Alternatively U- or E-shaped half-cores implemented twice or with a terminating magnetic connecting bar (I-shape), i.e. e.g. U-U, U-I, E-E, E-I shapes.

In the case of a split design, the winding can be wound separately onto a carrier body and then be pushed over the magnetic core.

Alternatively, a magnetic core composed of high-permeability material (such as e.g. ferrite, nanocrystalline strip or electrical sheet) with a defined air gap is also possible.

In the case where there is an air gap in the inductor core, the latter has to be produced from a material that is not electrically conductive, e.g. an insulating film or a plastic part. Otherwise, severe eddy currents occur in this spacer and result in heating.

The eddy current losses rise very greatly with the frequency and result in severe thermal loading in applications with considerable current harmonics.

The isolation of the coil windings and the surrounding air clearances and creepage paths have to be designed for the expected voltage spikes at rated currents In and rated frequency.

An overvoltage protection element USE can be arranged in parallel with the secondary winding, see FIG. 4.

This can involve a varistor or a bidirectional suppressor diode. The protection element USE limits the voltage spikes for currents above normal operating situations, such as e.g. in the case of a short circuit in the primary circuit.

In order to reduce/avoid high magnetization reversal losses as a result of current harmonics, a low-pass filter LPF is furthermore inserted between current converter and inductor, see FIG. 4. The filter forms a low-impedance electrical bypass for all current components above the filter cut-off frequency, i.e. all current components at frequencies above the filter cut-off frequency are damped or short-circuited in the low-pass filter LPF, and so such components no longer flow through inductor L and control unit ETU. The lower impedance for current components above the filter cut-off frequency results in less secondary voltage amplitude and thus a lower magnetic flux density for this frequency in the core. Since the losses in the magnetic core rise with the square of the flux density, that results in a significant reduction of the self-heating in the core.

FIG. 5 shows one example implementation of the low-pass filter LPF. The filter consists of a parallel arrangement of a first resistor R1 with a capacitor C1 and a common second resistor R2 arranged in series.

The filter together with the inductance of the secondary winding SW and the inductor L forms a resonant circuit. The resonant frequency is determined by the connection of the inductances LS in parallel with the capacitor C1.

$$f=1/(2\ Pi\ Root(Ls*C1))$$

The first and second resistors R1, R2 damp the resonance peak and influence the frequency-dependent impedance of the low-pass filter LPF. For frequencies far below the resonant frequency, the sum of the resistances of the first and second resistors R1, R2 forms the impedance. The latter has to be much greater than the reactance XL of the inductor L at rated frequency in order that the current-limiting effect of the inductor L is maintained. For frequencies significantly above the resonant frequency, R2 forms the impedance of the low-pass filter LPF. This impedance should be as small as possible in order to give rise to a good electrical bypass with respect to the inductor L and the control unit ETU in order that the losses remain low.

FIG. 6 shows an example profile of the current amplitudes in the circuit branch via inductor L and control unit ETU and in the circuit branch via the low-pass filter LPF or the resistor-capacitor network thereof. As a result of skillful selection of the first and second resistors R1, R2, the resonance peak is hardly evident. By contrast, the profile of the two current components clearly shows the expected shift in the secondary current from the active branch comprising inductor L and control unit ETU into the branch in the low-pass filter LPF as the frequency rises.

During operation on electrical power supply systems comprising switched-mode power supplies or power converters, high current components are often observed in the frequency range above 2 kHz. At present there are no internationally valid upper limits for these frequency ranges according to a standard. For the harmonic component in the frequency range below 2 kHz, at present limit values are defined in international standards. On the basis of this fact, by way of example, the resonant frequency from low-pass filter, inductor and current converter is dimensioned in the range below 2 kHz. The limit values from the standards assist in the dimensioning of the resistance component in the low-pass filter LPF. All current components from operation on power converters as mentioned above are thus short-circuited in the low-pass filter LPF. Thermal problems as a result of the losses from current harmonics can be minimized by dimensioning with the lowest possible impedance in the low-pass filter LPF.

A further reduction of the magnetization reversal losses in the energy converter core KCT is possible by way of the suitable choice of the magnetic material. Traditional energy/current converters having magnetic cores composed of stacked non-grain-oriented (NGO) or wound grain-oriented (GO) Fe—Si sheets are distinguished by a high saturation magnetization but also a wide hysteresis loop. The area within the hysteresis loop is a measure of the magnetization reversal losses. Since the magnetization reversal losses on account of eddy current components rise more than proportionally with the frequency, applications with a high proportion of current harmonics should preferably switch over to using wound nanocrystalline strips or ferrite cores. Both materials are distinguished by very narrow magnetic hysteresis loops and are suitable for use into the 100 kHz frequency range. Ferrite cores require significantly more core volume and thus structural space since the saturation magnetization amounts to only approximately 20% of that of Fe—Si sheets. Nanocrystalline strips, by contrast, attain at least 60% of the saturation magnetization of Fe—Si and have a significantly higher permeability. Therefore, it is possible to achieve a comparable power with approximately 20% more volume.

The reactance XL of the inductor L connected in series between energy/current converter (energy supply/source) and control unit ETU (sink) compensates for the power mismatch between source and sink with the consequence that power not required on the secondary side is not converted into heat. The concept functions at different frequencies since the secondary voltage rising linearly with the frequency from the current converter encounters a reactance rising linearly with the frequency.

The following advantages result from the separation of current converter and inductor.

- Current converter and inductor can be dimensioned separately.=>simpler design
- Current converter and inductor can be produced and/or purchased separately.=>cost advantages
- Inductor having a closed magnetic powder core of toroidal or U/U, E/E or U/I, E/I shape.=>cost advantages over FeSi core with air gap.
- The inductor should preferably be mounted outside the current converter in order to minimize the negative influence of the magnetic fields from high primary currents on the inductor.=>Additional flexibility in the structural space apportioning of the overall mechanical construction.
- High voltage spikes between current converter and inductor in the event of short-circuit currents are limited by an overvoltage protection element (e.g. varistor) in parallel with the secondary winding.=>higher safety
- High voltage spikes from current harmonics are avoided by way of a low-pass filter in parallel with the secondary winding.=>higher safety
- The resonant frequency from energy converter or the secondary winding thereof, inductor and low-pass filter should advantageously be below 2 kHz.=>Compatibility with normative requirements in (low-voltage) power supply systems with regard to harmonic component.
- The inductive and capacitive parallel resonance of the low-pass filter is damped by a resistor network, the first and second resistors R1, R2.
- Severe self-heating in the magnetic core of the energy converter/current converter and of the inductor as a result of magnetization reversal losses on account of current harmonics above 2 kHz is avoided by way of the low-pass filter.=>Thermal stability.
- A magnetic core for the current converter significantly reduces the magnetization reversal losses as a result of current harmonics.=>Thermal stability By way of embodiments of the invention, wherein energy converter and inductor are separated, i.e. an integrated magnetic design is dispensed with, high voltage peaks are avoided. A concept for the operation of a circuit breaker with respect to power supply systems subjected to harmonics to a great extent is provided.

Although the invention has been more specifically illustrated and described in detail by way of the example embodiment, nevertheless the invention is not restricted by the examples disclosed and other variations can be derived therefrom by the person skilled in the art, without departing from the scope of protection of the invention.

The invention claimed is:

1. A circuit breaker for interrupting an electrical circuit in an event of at least one of current and current-time period limit values being exceeded, the circuit breaker being a molded case circuit breaker or an air circuit breaker, comprising:
   an energy converter, a primary side of the energy converter being connected to the electrical circuit that is to be protected by interrupting the current in an event of at least one of current and current-time period limit values being exceeded, and a secondary side of the energy converter being configured to provide an energy supply for at least one control unit of the circuit breaker, the at least one control unit being an Electronic Trip Unit (ETU) of the molded case circuit breaker or the air circuit breaker, the secondary side of the energy converter comprising two terminals that form a secondary-side output of the energy converter and are connected with two respective inputs of the at least one control unit;
   a choke, connected between a secondary-side output terminal of the energy converter and one of the inputs of the at least one control unit of the circuit breaker and configured to reduce apparent power of the energy converter;
   an overvoltage protection element connected in parallel with the secondary-side output of the energy converter; and
   a low-pass filter LPF positioned between the overvoltage protection and the choke, an output of the low-pass filter being connected to the at least one control unit via the choke.

2. The circuit breaker of claim 1, wherein a conductor of the electrical circuit forms the primary side of the energy converter.

3. The circuit breaker of claim 2, wherein the choke is arranged such that an area enclosed by a choke core is arranged parallel to a primary conductor of the primary side.

4. The circuit breaker of claim 1, wherein the choke is arranged at a first spatial distance from the energy converter.

5. The circuit breaker of 4, wherein a core of the energy converter and a core of the choke are magnetically and electrically isolated from one another.

6. The circuit breaker of claim 1, wherein the choke is arranged horizontally with respect to a primary conductor.

7. The circuit breaker of claim 1, wherein the choke includes a magnetic powder core.

8. The circuit breaker of claim 7, wherein the magnetic powder core is closed.

9. The circuit breaker of claim 7, wherein the magnetic powder core comprises Fe, Fe/Ni alloys or ferrite.

10. The circuit breaker of claim 7, wherein the magnetic powder core is a toroidal core, a U-shaped half-core or E-shaped half-core implemented twice or with a terminating I-shaped connecting core.

11. The circuit breaker of claim 1, wherein the choke includes a magnetic core composed of a high-permeability material.

12. The circuit breaker of claim 11, wherein the high-permeability material comprises ferrite, nanocrystalline strip or electrical sheet.

13. The circuit breaker of claim 11, wherein the magnetic core has an air gap.

14. The circuit breaker of claim 1, wherein the secondary-side output of the energy converter is connected to the low-pass filter, the output of the low-pass filter being connected to the at least one control unit via the choke.

15. The circuit breaker of claim 14, wherein the low-pass filter has a capacitor.

16. The circuit breaker of claim 15, wherein the capacitor is connected in series with a resistor.

17. The circuit breaker of claim 15, wherein a resistor is connected in parallel with the capacitor.

18. A second inductor for the low-pass filter connected to the secondary-side output of the energy converter of claim 1.

19. The circuit breaker of claim 1, wherein the choke is directly connected with the secondary side output terminal of the energy converter and one of the inputs of the at least one control unit.

* * * * *